(12) United States Patent
Fukuda

(10) Patent No.: US 10,923,606 B2
(45) Date of Patent: Feb. 16, 2021

(54) PHOTOELECTRIC CONVERSION ELEMENT

(71) Applicant: KANEKA CORPORATION, Osaka (JP)

(72) Inventor: Masanori Fukuda, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/344,924

(22) PCT Filed: Oct. 11, 2017

(86) PCT No.: PCT/JP2017/036751
§ 371 (c)(1),
(2) Date: Apr. 25, 2019

(87) PCT Pub. No.: WO2018/079257
PCT Pub. Date: May 3, 2018

(65) Prior Publication Data
US 2019/0259884 A1 Aug. 22, 2019

(30) Foreign Application Priority Data
Oct. 26, 2016 (JP) .............................. JP2016-209846

(51) Int. Cl.
*H01L 31/00* (2006.01)
*H01L 31/0224* (2006.01)
*H01L 23/544* (2006.01)
(52) U.S. Cl.
CPC ........ *H01L 31/0224* (2013.01); *H01L 23/544* (2013.01); *H01L 2223/54433* (2013.01)

(58) Field of Classification Search
CPC ......... H01L 23/544; H01L 2223/54433; H01L 31/022433; H01L 2223/54413; H01L 2223/5442
See application file for complete search history.

(56) References Cited

U.S. PATENT DOCUMENTS 6,578,764 B1 * 6/2003 Hiraishi ................ H01L 23/544
235/454
2005/0133084 A1   6/2005 Joge et al.
2009/0050198 A1   2/2009 Mueller et al.
(Continued)

FOREIGN PATENT DOCUMENTS

JP    H05-93054 U       12/1993
JP    H0593054 U    *  12/1993
(Continued)

OTHER PUBLICATIONS

English machine translation of JPH05-93054 U (Year: 2020).*
(Continued)

*Primary Examiner* — Angelo Trivisonno
(74) *Attorney, Agent, or Firm* — Osha Bergman Watanabe & Burton LLP

(57) ABSTRACT

A photoelectric conversion element includes a plurality of finger electrodes, which extend in a first direction, and are aligned with a first interval in a second direction orthogonal to the first direction, and an identification mark arranged so that a second interval, which is greater than the first interval, separates the identification mark from the plurality of finger electrodes in the second direction.

7 Claims, 2 Drawing Sheets

(56) References Cited

U.S. PATENT DOCUMENTS

| | | | | |
|---|---|---|---|---|
| 2013/0193560 A1* | 8/2013 | Usui | ................. | H01L 29/06 |
| | | | | 257/618 |
| 2013/0273687 A1* | 10/2013 | Akimoto | ............ | H01L 31/0682 |
| | | | | 438/98 |
| 2016/0126374 A1 | 5/2016 | Kim et al. | | |

FOREIGN PATENT DOCUMENTS

| | | | |
|---|---|---|---|
| JP | 2002-64214 | A | 2/2002 |
| JP | 2005-116906 | A | 4/2005 |
| JP | 2007-306041 | A | 11/2007 |
| JP | 2009-528687 | A | 8/2009 |
| JP | 5627855 | B2 | 11/2014 |
| WO | 2007/099138 | A1 | 9/2007 |
| WO | 2012/176473 | A1 | 12/2012 |

OTHER PUBLICATIONS

International Search Report issued in International Application No. PCT/JP20171036751, dated Dec. 12, 2017 (2 pages).
Written Opinion issued in International Application No. PCT/JP2017/036751, dated Dec. 12, 2017 (3 pages).

* cited by examiner

PHOTOELECTRIC CONVERSION ELEMENT

TECHNICAL FIELD

The present invention relates to a photoelectric conversion element.

BACKGROUND ART

In Patent Literatures 1 and 2, there are disclosed manufacturing methods in which an identification mark for identifying a solar battery cell is formed by laser irradiation.

CITATION LIST

Patent Literature

[PTL 1] JP 2009-528687 A
[PTL 2] WO 2012/176473 A1

SUMMARY OF INVENTION

Technical Problem

In Patent Literature 1, a current collecting electrode is formed away from around an identification mark portion. However, the identification mark is read with an optical scanner with a poor efficiency because light reflected from the current collecting electrode in the vicinity of the identification mark is intense.

This disclosure has been made in view of the problem described above, and an object of this disclosure is to improve the efficiency of reading an identification mark in a photoelectric conversion element.

Solution to Problem (1) According to one embodiment of this disclosure, there is provided a photoelectric conversion element including: a plurality of finger electrodes, which extend in a first direction, and are aligned with a first interval along a second direction orthogonal to the first direction; and an identification mark arranged so that a second interval, which is greater than the first interval, separates the identification mark from the plurality of finger electrodes in the second direction.

(2) In the photoelectric conversion element according to Item (1), the identification mark has a plurality of pits to differentiate reflectance within a substantially rectangular area.

(3) In the photoelectric conversion element according to Item (1) or (2), the plurality of finger electrodes and the identification mark are arranged so that a third interval, which is greater than the first interval, separates the identification mark from the plurality of finger electrodes in the first direction.

(4) In the photoelectric conversion element according to any one of Items (1) to (3), the identification mark is formed in a substantially rectangular area having a first side and a second side, which are substantially parallel to the first direction, and a third side and a fourth side, which are substantially parallel to the second direction, out of the plurality of finger electrodes, a finger electrode that is the most adjacent to the first side is arranged so that the second interval separates the finger electrode from the first side, and out of the plurality of finger electrodes, a finger electrode that is the most adjacent to the second side is arranged so that a fourth interval, which is greater than the first interval, separates the finger electrode from the second side.

(5) In the photoelectric conversion element according to any one of Items (1), (2), and (4), the identification mark is formed in a substantially rectangular area having a first side and a second side, which are substantially parallel to the first direction, and a third side and a fourth side, which are substantially parallel to the second direction, out of the plurality of finger electrodes, finger electrodes having end portions closest to the third side are arranged so that a third interval, which is greater than the first interval, separates the finger electrodes from the third side, and out of the plurality of finger electrodes, finger electrodes having end portions closest to the fourth side are arranged so that a fifth interval, which is greater than the first interval, separates the finger electrodes from the fourth side.

(6) In the photoelectric conversion element according to any one of Items (1) to (5), the identification mark is placed on a rear surface side of a light receiving surface.

(7) In the photoelectric conversion element according to any one of Items (1) to (6), the second interval is less than double the first interval.

DESCRIPTION OF EMBODIMENTS

An embodiment of this disclosure is described below with reference to the drawings.

Figure 1:
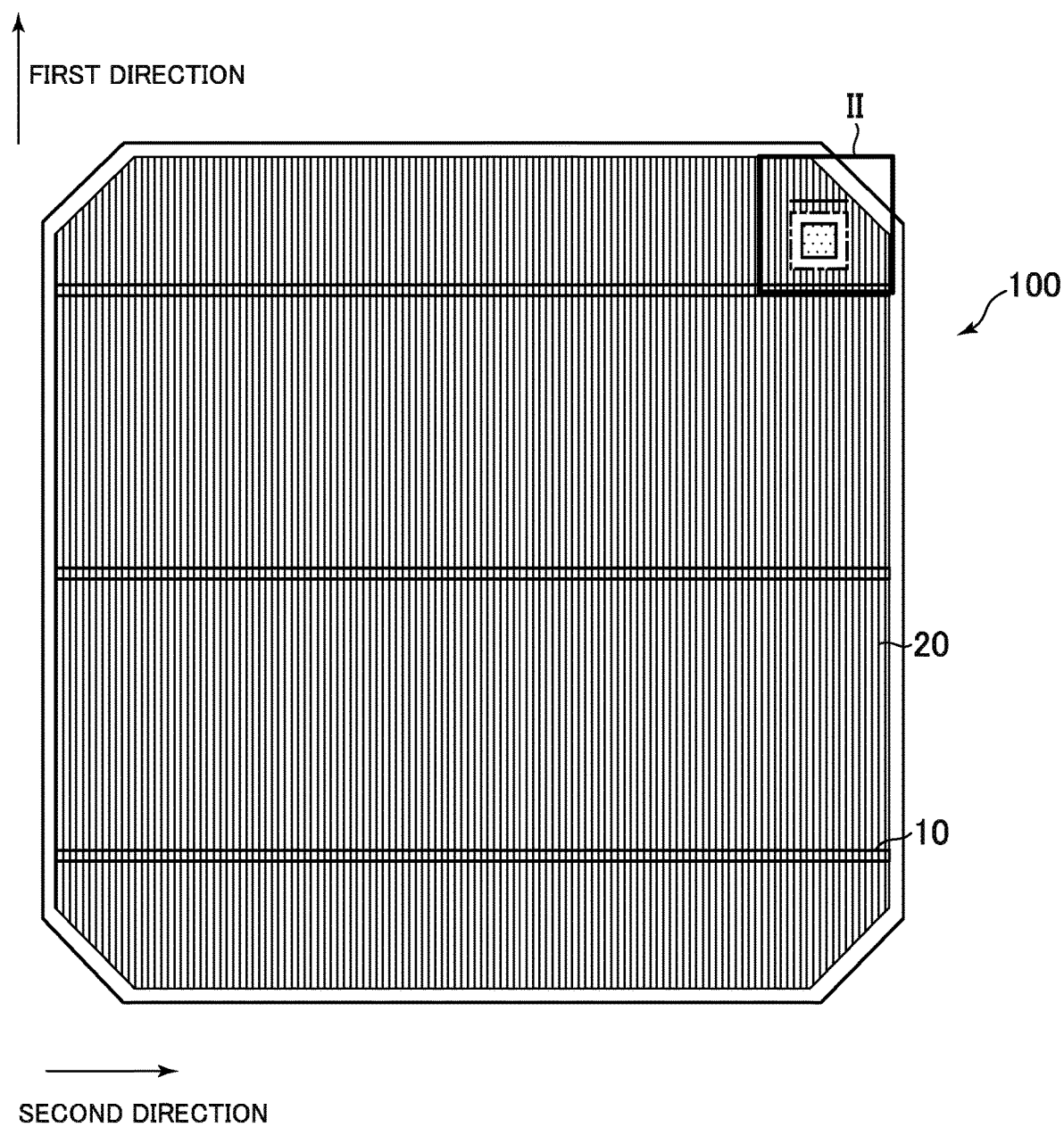
FIG. 1 is a plan view for schematically illustrating a rear surface side of a photoelectric conversion element according to an embodiment of the present disclosure.

FIG. 1 is a schematic plan view for schematically illustrating a photoelectric conversion element according to this embodiment.

As illustrated in FIG. 1, a photoelectric conversion element 100 according to this embodiment has a current collecting electrode on a rear surface side of a light receiving surface of the photoelectric conversion element 100. The current collecting electrode includes finger electrodes 20 and bus bar electrodes 10 in order to satisfy both light collection efficiency and current collection efficiency. A large number of finger electrodes 20 are arranged substantially parallel to one another to collect electricity generated inside the photoelectric conversion element 100. The bus bar electrodes 10 are wide compared to the width of each of the finger electrodes 20, and intersect with the finger electrodes 20 substantially at right angles to take out the electricity collected by the finger electrodes 20 to the outside.

A direction to which the finger electrodes 20 extend is defined as a first direction, and a direction orthogonal to the first direction, in which the finger electrodes are aligned, is defined as a second direction.

Figure 2:
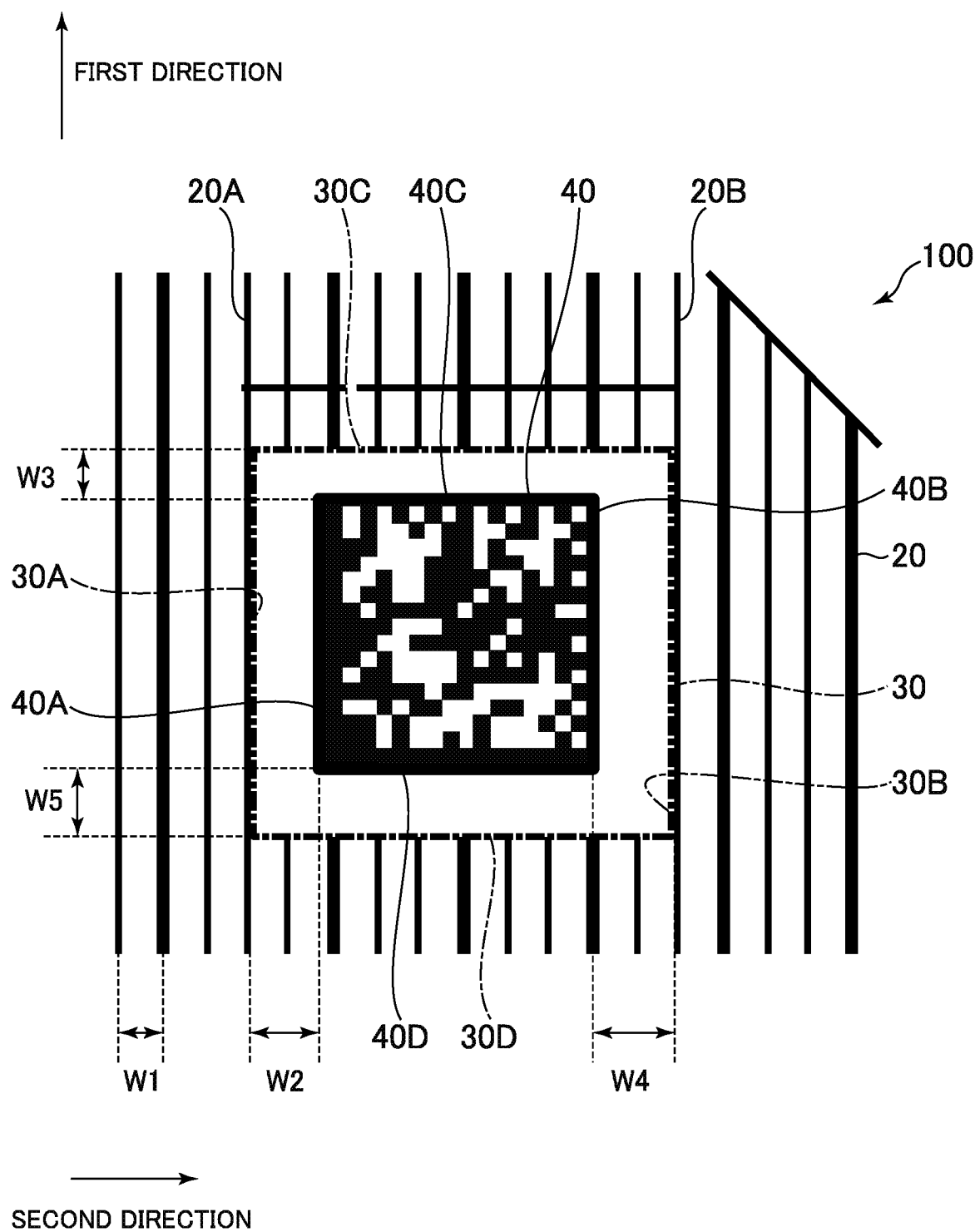
FIG. 2 is an enlarged plan view for schematically illustrating the rear surface side of the photoelectric conversion element according to the embodiment.

FIG. 2 is an enlarged plan view of a portion II in FIG. 1.

The finger electrodes 20 are arranged at a first interval W1 substantially throughout the entire rear surface side of the photoelectric conversion element 100. However, no finger electrodes 20 are formed in an electrode opening area 30, which has a substantially rectangular shape. The substantially rectangular electrode opening area 30 has a pair of sides 30A and 30B, which are substantially parallel to the first direction, and another pair of sides 30C and 30D, which are substantially parallel to the second direction. The pair of sides 30A and 30B substantially parallel to the first direction are each in contact with one of the finger electrodes 20. The pair of sides 30C and 30D substantially parallel to the second direction are in contact with end portions of the finger electrodes 20 that are orthogonal to the side 30C and end portions of the finger electrodes 20 that are orthogonal to the side 30D, respectively.

An identification mark 40 is formed in the electrode opening area 30, spaced with intervals from the finger electrodes 20. The identification mark 40 is configured from a plurality of dot-shaped pits arranged in a substantially rectangular area. The light reflectance in the pitted area with pits differs significantly from the light reflectance in an area without pits, and hence the identification mark 40 can be read by an optical scanner. The pits can be formed by, for example, laser irradiation.

The substantially rectangular area, in which the identification mark 40 is formed, has a first side 40A and a second side 40B, which are parallel to the first direction, and a third side 40C and a fourth side 40D, which are parallel to the second direction. In FIG. 2, which is a diagram for illustrating this embodiment, while the first side 40A and the second side 40B are illustrated as the left side and right side, respectively, of the area in which the identification mark 40 is formed, the first side 40A and the second side 40B may be the right side and the left side, respectively. In this embodiment, however, the scanning direction of an optical scanner is taken into account, and a side on which the optical scanner enters into the area of the identification mark 40 is set as the first side 40A. In FIG. 2, which is a diagram for illustrating this embodiment, while the third side 40C and the fourth side 40D are illustrated as the top side and bottom side, respectively, of the area in which the identification mark 40 is formed, the third side 40C and the fourth side 40D may be the bottom side and the top side, respectively.

Out of the finger electrodes 20 circumscribing the electrode opening area 30, the finger electrode 20 that runs side by side with the first side 40A at the closest distance is defined as a first finger electrode 20A. The distance between the first finger electrode 20A and the first side 40A in the second direction is defined as a second interval W2. In other words, the distance between the side 30A, which is substantially parallel to the first direction in the electrode opening area 30, and the first side 40A in the identification mark 40 is the second interval W2.

Out of the finger electrodes 20 circumscribing the electrode opening area 30, the finger electrode 20 that runs side by side with the second side 40B at the closest distance is defined as a second finger electrode 20B. The distance between the second finger electrode 20B and the second side 40B in the second direction is defined as a fourth interval W4. In other words, the distance between the side 30B, which is substantially parallel to the first direction in the electrode opening area 30, and the second side 40B in the identification mark 40 is the fourth interval W4.

The distance between the side 30C, which is substantially parallel to the second direction in the electrode opening area 30, and the third side 40C in the identification mark 40 is a third interval W3. In other words, the distance between the end portions of the finger electrodes in contact with the side 30C of the electrode opening area 30 and the third side 40C in the identification mark 40 is the third interval W3.

The distance between the side 30D, which is substantially parallel to the second direction in the electrode opening area 30, and the fourth side 40D in the identification mark 40 is a fifth interval W5. In other words, the distance between the end portions of the finger electrodes in contact with the side 30D of the electrode opening area 30 and the fourth side 40D in the identification mark 40 is the fifth interval W5.

The finger electrodes 20 and the identification mark 40 are arranged so that the second interval W2 is greater than the first interval W1 in the second direction, which is the alignment direction of the finger electrodes 20. This configuration reduces the influence of light reflection by the current collecting electrode on reading precision with which the identification mark 40 is read with an optical scanner.

Another advantage of setting the second interval W2 on the optical scanner entering side to be greater than the first interval W1 is an improved efficiency in reading the identification mark. For instance, an optical recognition scanner scanning in the second direction to check for the presence of the identification mark 40 determines the presence/absence of the finger electrodes 20 from whether the reflectance is high or low. Because the finger electrodes 20 are arranged with adjacent finger electrodes 20 spaced apart from each other by the first interval W1, which is a given interval, the reflectance read by the scanner varies at fixed intervals depending on the scanning distance. Once the scanner enters the electrode opening area 30, however, the scanner does not come across a high reflectance area even after scanning a distance equivalent to the first interval W1. This enables the scanner to determine that the present scanning point is inside the electrode opening area 30, and that the scanner soon comes within reach of the region in which the identification mark 40 is formed. As a result, the efficiency of reading an identification mark is improved.

The electrodes in this embodiment are also arranged so that the fourth interval W4 is greater than the first interval W1 in the second direction. This configuration further reduces the influence of light reflection by the current collecting electrode on reading precision with which the identification mark 40 is read with an optical scanner.

In the first direction, in which the finger electrodes 20 extend, the finger electrodes 20 and the identification mark 40 are desirably arranged so that the third interval W3 and the fifth interval W5, which are each greater than the first interval W1, separate the identification mark 40 from the finger electrodes 20. With the third interval W3 and the fifth interval W5 set wide, a distance long enough to differentiate the identification mark 40 from a perimeter created by the finger electrodes 20 is secured in the first direction, too, and the reading efficiency is improved when reading the identification mark 40.

The identification mark 40, which is placed on the rear surface side of the light receiving surface in this embodiment, may be placed on the light receiving surface side. From the viewpoints of power generation efficiency on the light receiving surface and design, however, the identification mark 40 is desirably placed on the rear surface side of the light receiving surface.

The second interval W2 is desirably less than double the first interval W1. Local damage to a semiconductor substrate from the process of forming the pits (e.g., laser ablation) generally remains in the area in which the identification mark 40 is formed out of the electrode opening area 30. The local damage acts as a recombination center, thereby causing a marked drop in power generation efficiency. The drop does not occur in an area in which the identification mark 40 is not formed out of the electrode opening area 30. Charge carriers, particularly ones in a part of the electrode opening area 30 in which the identification mark 40 is not formed, are accordingly collected by the finger electrodes 20 that are in close proximity to the perimeter of the electrode opening area 30. In view of the efficiency of collecting the carriers, the second interval W2 is set to a width less than double the first interval W1 so that the distance in the second direction between the identification mark 40 and the finger electrode 20 is not too long. With this configuration, a drop in the current collection efficiency of carriers generated in the vicinity of the identification mark 40 can be reduced.

In this embodiment, the electrode opening area 30 has a width of 6 mm and the identification mark 40 has a width of 3.5 mm in the first direction and the second direction, the first interval W1 is 0.68 mm, the second interval W2 and the fourth interval W4 are each 1.25 mm, and the third interval W3 and the fifth interval W5 are each 1.25 mm. In short, in this embodiment, the identification mark 40 having a square shape smaller than the square-shaped electrode opening area 30 is placed at the center of the electrode opening area 30. The second interval W2 and the fourth interval W4 are each greater than the first interval W1, and less than double the first interval W1. The third interval W3 and the fifth interval W5 are each greater than the first interval W1, and less than double the first interval W1.

In this embodiment, the photoelectric conversion element 100 has what is called a bi-facial structure, which is a structure having a current collecting electrode on the light receiving surface and the rear surface each, and is described with reference to a drawing of the rear surface side and others. However, the structure of the photoelectric conversion element 100 is not limited thereto, and the photoelectric conversion element 100 may also employ a structure called a back contact structure, in which the positive pole and the negative pole are both placed on the rear surface side.

The description of this embodiment takes as an example a case in which the identification mark 40 is a data matrix. However, the identification mark 40 is not particularly limited as long as a readable data format is used. The identification code used may have a letter symbol format, or may be a barcode, a QR code (trademark), a data matrix, or other two-dimensional codes. From the viewpoint of data density, two-dimensional codes are preferred.

The depth of the pits forming the identification mark 40 is not particularly limited. It is preferred, however, for the pits to have a depth of 5 μm or more and 100 μm or less, and a depth of 10 μm or more and 40 μm or less is most preferred. When the pits are shallow, the difference in reflectance between the pitted area and the area without pits is small and the reading efficiency accordingly drops. Meanwhile, when the pits are deep, the strength in the vicinity of the pitted area markedly drops, and may drop to a level that results in damage to the photoelectric conversion element 100. A preferred opening diameter of each pit is from about 50 μm to about 100 μm. While the reading efficiency drops when the opening diameter is small, the strength in the vicinity of the pitted area markedly drops, and may drop to a level that results in damage to the photoelectric conversion element, when the opening diameter is large.

The invention claimed is:

1. A photoelectric conversion element, comprising:
a plurality of finger electrodes, which extend in a first direction, and are aligned with each other and separated by a first interval along a second direction orthogonal to the first direction; and
an identification mark positioned in an electrode opening area and arranged so that a second interval, which is greater than the first interval, separates the identification mark from the plurality of finger electrodes in the second direction,
wherein the plurality of finger electrodes produce a higher reflectance as compared to the electrode opening area.

2. The photoelectric conversion element according to claim 1, wherein the identification mark has a plurality of pits to differentiate reflectance within a substantially rectangular area.

3. The photoelectric conversion element according to claim 1, wherein the plurality of finger electrodes and the identification mark are arranged so that a third interval, which is greater than the first interval, separates the identification mark from the plurality of finger electrodes in the first direction.

4. The photoelectric conversion element according to claim 1,
wherein the identification mark is formed in a substantially rectangular area having a first side and a second side, which are substantially parallel to the first direction, and a third side and a fourth side, which are substantially parallel to the second direction,
wherein, out of the plurality of finger electrodes, a finger electrode that is the most adjacent to the first side is arranged so that the second interval separates the finger electrode from the first side, and
wherein, out of the plurality of finger electrodes, a finger electrode that is the most adjacent to the second side is arranged so that a fourth interval, which is greater than the first interval, separates the finger electrode from the second side.

5. The photoelectric conversion element according to claim 1,
wherein the identification mark is formed in a substantially rectangular area having a first side and a second side, which are substantially parallel to the first direction, and a third side and a fourth side, which are substantially parallel to the second direction,
wherein, out of the plurality of finger electrodes, finger electrodes having end portions closest to the third side are arranged so that a third interval, which is greater than the first interval, separates the finger electrodes from the third side, and
wherein, out of the plurality of finger electrodes, finger electrodes having end portions closest to the fourth side are arranged so that a fifth interval, which is greater than the first interval, separates the finger electrodes from the fourth side.

6. The photoelectric conversion element according to claim 1, wherein the identification mark is placed on a rear surface side of a light receiving surface.

7. The photoelectric conversion element according to claim 1, wherein a width of the second interval is less than twice a width of the first interval.

* * * * *